United States Patent [19]

Lee

[11] Patent Number: 5,512,514
[45] Date of Patent: Apr. 30, 1996

[54] SELF-ALIGNED VIA AND CONTACT INTERCONNECT MANUFACTURING METHOD

[75] Inventor: Chong E. Lee, Milpitas, Calif.

[73] Assignee: Spider Systems, Inc., Austin, Tex.

[21] Appl. No.: 336,382

[22] Filed: Nov. 8, 1994

[51] Int. Cl.$^6$ .................. H01L 21/283; H01L 21/308
[52] U.S. Cl. ............. 437/195; 437/228; 148/DIG. 106
[58] Field of Search ..................... 437/195, 187, 437/189, 228, 228 M, 228 W; 156/659, 661.1

[56] References Cited

U.S. PATENT DOCUMENTS

| | | | |
|---|---|---|---|
| 4,410,622 | 10/1983 | Dalal et al. | 430/312 |
| 4,536,951 | 8/1985 | Rhodes et al. | 437/190 |
| 4,614,021 | 9/1986 | Hulseweh | 156/643 |
| 4,810,332 | 3/1989 | Pan | 204/15 |
| 4,879,257 | 11/1989 | Patrick | 437/195 |
| 4,914,056 | 4/1990 | Okumura | 437/192 |
| 4,917,759 | 4/1990 | Fisher et al. | 156/643 |
| 4,960,489 | 10/1990 | Roeska et al. | 156/661.1 |
| 5,164,332 | 11/1992 | Kumar | 437/198 |
| 5,192,713 | 3/1993 | Harada | 437/192 |
| 5,202,579 | 4/1993 | Fujii et al. | 257/751 |
| 5,216,282 | 6/1993 | Cote et al. | 257/773 |
| 5,219,639 | 6/1993 | Sugawara et al. | 428/209 |

FOREIGN PATENT DOCUMENTS

| | | | |
|---|---|---|---|
| 1-36049 | 2/1989 | Japan | 437/981 |

Primary Examiner—T. N. Quach
Attorney, Agent, or Firm—Bruce E. Garlick

[57] ABSTRACT

An integral via structure and contact manufacturing process (10) with a first conductive layer patterning process section (12) that includes depositing a first conductive layer (34), creating a first via etch mask (44) on the first conductive layer (34), partially etching the exposed portions of the first conductive layer (34) to create first via structures (52) and a remaining first conductive layer (34), stripping the first via etch mask (44), masking the remaining first conductive layer (34) with a first layer etch mask (56) that covers the via structures (52), etching the exposed portions of the remaining first conductive layer (34) to form a first conductive pattern (60) having integral via structures (52). A first dielectric (72) is deposited and planarized to expose top portions of the first via structure (52) and a second conductive layer (90) is deposited, making contact with the first via structures (52). The second conductive layer (90) is patterned in the same manner as the first conductive layer (34) to create a second conductive pattern (102) with integral second via structures (98). A second dielectric layer (104) is deposited and planarized in the same manner as the first dielectric (72) exposing the second via structures (98). A third conductive layer is deposited, making contact with the second via structures (98) and patterned with convention methods to create a third conductive pattern (110). The process concludes with conventional passivation methods. The above mentioned steps may be repeated multiple times to form multiple, interconnected conductive layers.

52 Claims, 8 Drawing Sheets

SELF-ALIGNED VIA AND CONTACT INTERCONNECT MANUFACTURING METHOD

TECHNICAL FIELD

The present invention relates to semiconductor device manufacturing, and more particularly, to an improved method of manufacturing via structures for providing vertical interconnects in multi-layer metallization designs.

BACKGROUND ART

Semiconductor processing has resulted in increasingly complex and powerful integrated circuits. By scaling down device size and employing improved materials, circuit power consumption continues to be reduced and operating speeds increased.

Large scale integrated circuits are now commonly utilizing multilevel metallization schemes involving two or more patterned conductive layers, each conductive layer being separated by insulation layers. The conductive layers are connected by vertically extending via structures. The combination of conductive layers and via structures creates the "wiring pattern" for the integrated circuit.

Prior art methods accomplish vertical, conductive interconnects between metallization layers using by depositing metal into an etched hole. These methods typically begin with the deposition of the first metallization layer. The first metallization layer is patterned, typically by creating an etch mask using photolithographic techniques, and subsequently etching the first metallization layer. The etch mask is stripped and the patterned layer is covered with a deposited dielectric. Via holes are then etched through the dielectric layer to the first metallization layer and filled with a conductive material. Prior art methods accomplish this step by a number of different methods. One prior art method involves depositing a first conductive layer over the dielectric layer and into the hole. The resulting structure includes a first metal line, a via hole and a second metal line that extends into the via hole. Unfortunately, the depth of via holes can result in poor step coverage, particularly at the bottom of the via hole. The lack of adequate step coverage leads to high resistance or "opens" between the metal layers, which can degrade circuit performance.

When manufacturing metallization patterns of very small geometries, structures using via holes to electrically connect a top and bottom conductive pattern also have the drawback of requiring an overlay. An overlay is a widening of the lower conductive pattern where a via hole is anticipated, to ensure the via hole will be properly aligned with the lower conductive layer. Overlays reduce the minimum packing density of patterns by forcing greater spaces between adjacent lines in a conductive pattern.

Another method of providing a conductive via structure between metallization layers is discussed in U.S. Pat. No. 5,202,579 issued to Fuji et al. Similar to the first prior art method described above, the '579 patent describes a process of depositing a tungsten film and subsequently etching back that film to produce a buried tungsten plug. The '579 patent, due to the reactivity between aluminum and tungsten, requires a complex sandwich layer structure of titanium and titanium nitride, tungsten, and then a second titanium and titanium nitride layer. Such complex metallization schemes can increases process complexity and processing time.

A third prior art method is taught in U.S. Pat. No. 5,192,713 issued to Yusuke Harada. The '713 patent utilizes a selective chemical vapor deposition (CVD) process to deposit tungsten in a via hole while doping another via hole with arsenic to retard the formation of a tungsten plug. The selective tungsten CVD process requires a particular types of substrate, typically polysilicon, and often requires an entire deposition system dedicated solely to depositing tungsten. This can increase processing time and be a costly method of creating viable via structures between metallization layers.

None of the prior art addresses the need for a simple via structure and contact manufacturing process that produces repeatable via structures having low resistance and that accomplishes these ends without excessive equipment costs.

SUMMARY OF THE INVENTION

Accordingly, it is an object of the present invention to provide a via structure and contact manufacturing process that produces via structures having improved resistance between conductive layers.

It is another object of the present invention to provide a via structure and contact manufacturing process that does not require a via hole etch process step.

It is yet another object of the present invention to provide a via structure and contact manufacturing process that does not require a via hole filling process step.

Yet another object of the present invention is to provide a via structure and contact manufacturing process that eliminates the need for specialized via deposition equipment.

Briefly, the preferred embodiment of the present invention is a via structure and contact manufacturing process for integrated circuits having multi-layer metallization schemes. The process creates an integral via structure that connects a first conductive pattern with a second conductive pattern. The interconnect and contact manufacturing process includes the general steps of creating a first conductive pattern with integrally formed via structures, depositing and planarizing a insulative interlayer over the first conductive pattern, and creating a second conductive pattern.

In the preferred embodiment, the creation of the first conductive pattern includes depositing a first conductive layer having a uniform vertical thickness and placing a via etch mask on the first conductive layer. The via etch mask has a number of via mask portions at desired via structure positions. The first conductive layer is partially etched, and the via masks result in a partially etched first conductive layer with upward extending via structures. A first pattern etch mask is then placed on the partially etched first conductive layer, including the via structures, and a first pattern etch is applied. The first pattern etch etches through the exposed portions of the first conductive layer and creates the first conductive pattern.

Once the first conductive pattern has been created an insulative interlayer is deposited over the first conductive pattern, including the via structures. The insulative interlayer is then planarized, bringing the top of the interlayer level with the via structures. This results in an interlayer top surface that includes exposed via structures.

A second conductive layer is deposited over the insulative interlayer and makes conductive contact with the via structures. A second pattern mask is created on the second conductive layer and the second conductive layer given a second pattern etch. The resulting second conductive pattern is now conductively connected to the first conductive pattern by the integrally formed via structures.

An advantage of the present invention is that it provides a via structure and contact manufacturing process for creating self aligned via structure.

Yet another object of the present invention is that it reduces the number of process steps necessary to create a vertical interconnection between horizontal conductive layers.

Still another advantage of the present invention is that it provides a process for simultaneously forming via structures with a metallization pattern.

Yet another advantage of the present invention is that it provides a via structure and contact manufacturing process that can be implemented to create multi-level metallization schemes.

Another advantage of the present invention is that it provides a via structure and contact manufacturing process that eliminates the problems created by redeposition of dielectric within via holes and contact holes during via etch and contact etch.

Yet another advantage of the present invention is that it provides a via structure and contact manufacturing process that eliminates the need for a pre-metal deposition via hole and contact hole cleaning step.

Another advantage of the present invention is that it eliminates plasma induced damage created by a via hole and contact hole etch.

Yet another advantage of the present invention is that overlay is not needed around the via and contact structures.

These and other objects and advantages of the present invention will become clear to those skilled in the art in view of the description of the best presently known mode of carrying out the invention and the industrial applicability of the preferred embodiment as described hereto and as illustrated in the several figures of the drawing.

BEST MODE OF CARRYING OUT THE INVENTION

The best presently known mode for carrying out the present invention is a process for manufacturing via structures between conductive layers on a semiconductor device. The process uses metallization patterning techniques to etch self-aligned via structures, integral to the metallization pattern below.

The inventive process is repeatable with each subsequent conductive layer. The same general method of creating a via structure between a first conductive layer and a second conductive layer can be used to create an interconnect between a second conductive layer and a third conductive layer. Thus, the via structure and contact manufacturing process of the present invention can be employed to accomplish all the vertical connections on an integrated circuit. The preferred embodiment, as set forth below, repeats the process twice to create via structures between three metallization layers.

In the process of the present invention a first conductive layer is deposited and then patterned with vertically extending via structures in place. A dielectric interlayer is deposited and subsequently planarized so as to be level with the via structures. A second conductive layer is then deposited over the interlayer and patterned in the same manner as the first conductive layer. A second dielectric layer is deposited over the second conductive layer and then planarized. The process concludes with the deposition and patterning of a third conductive layer over the second dielectric. The resulting structure is a triple metal device having first via structures connecting the first conductive layer with the second conductive layer, and second via structures connecting the second conductive layer with the third conductive layer.

Figure 1A:
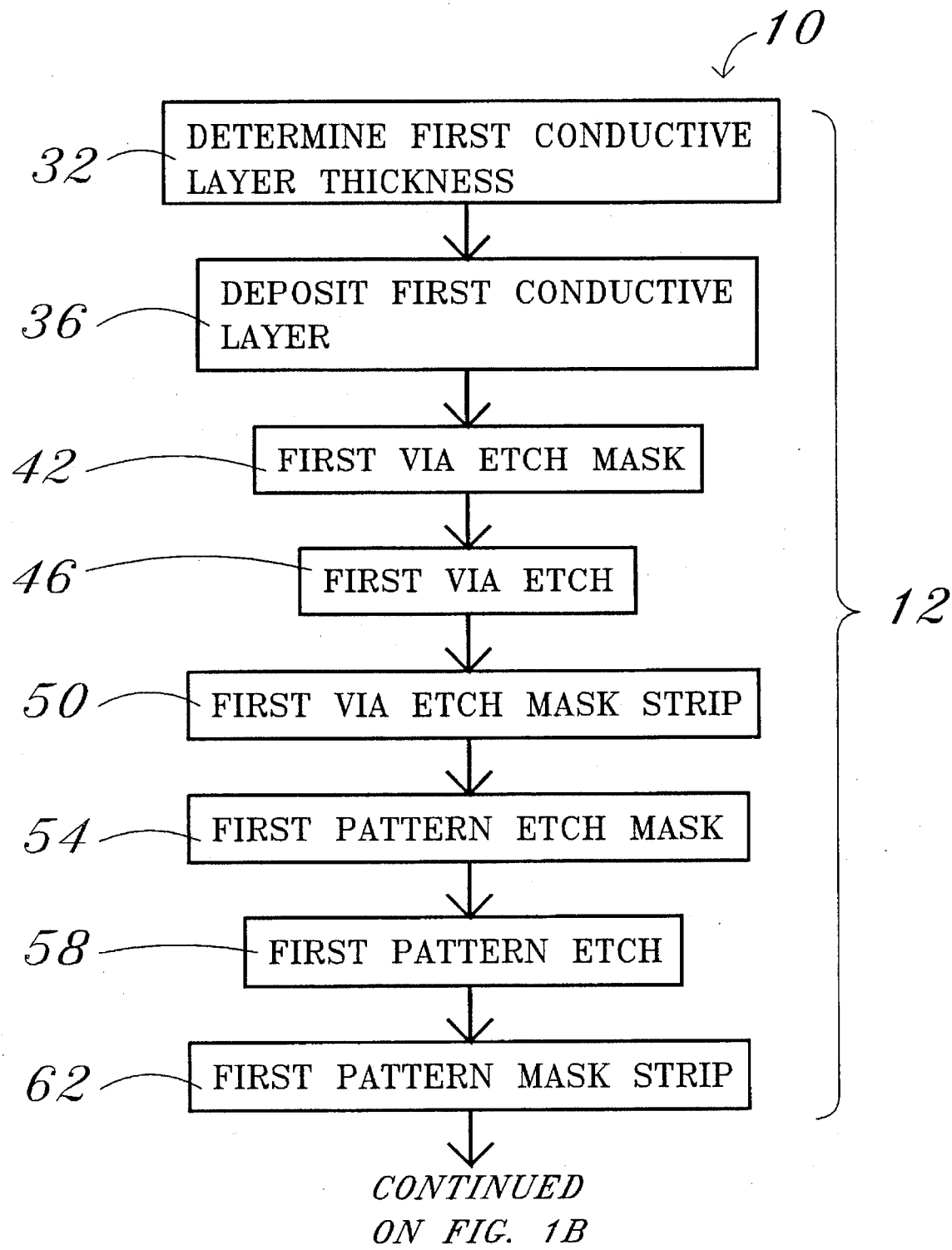
FIGS. 1A–1B is a flow chart setting forth the process of the preferred embodiment of the present invention.
Figure 1B:
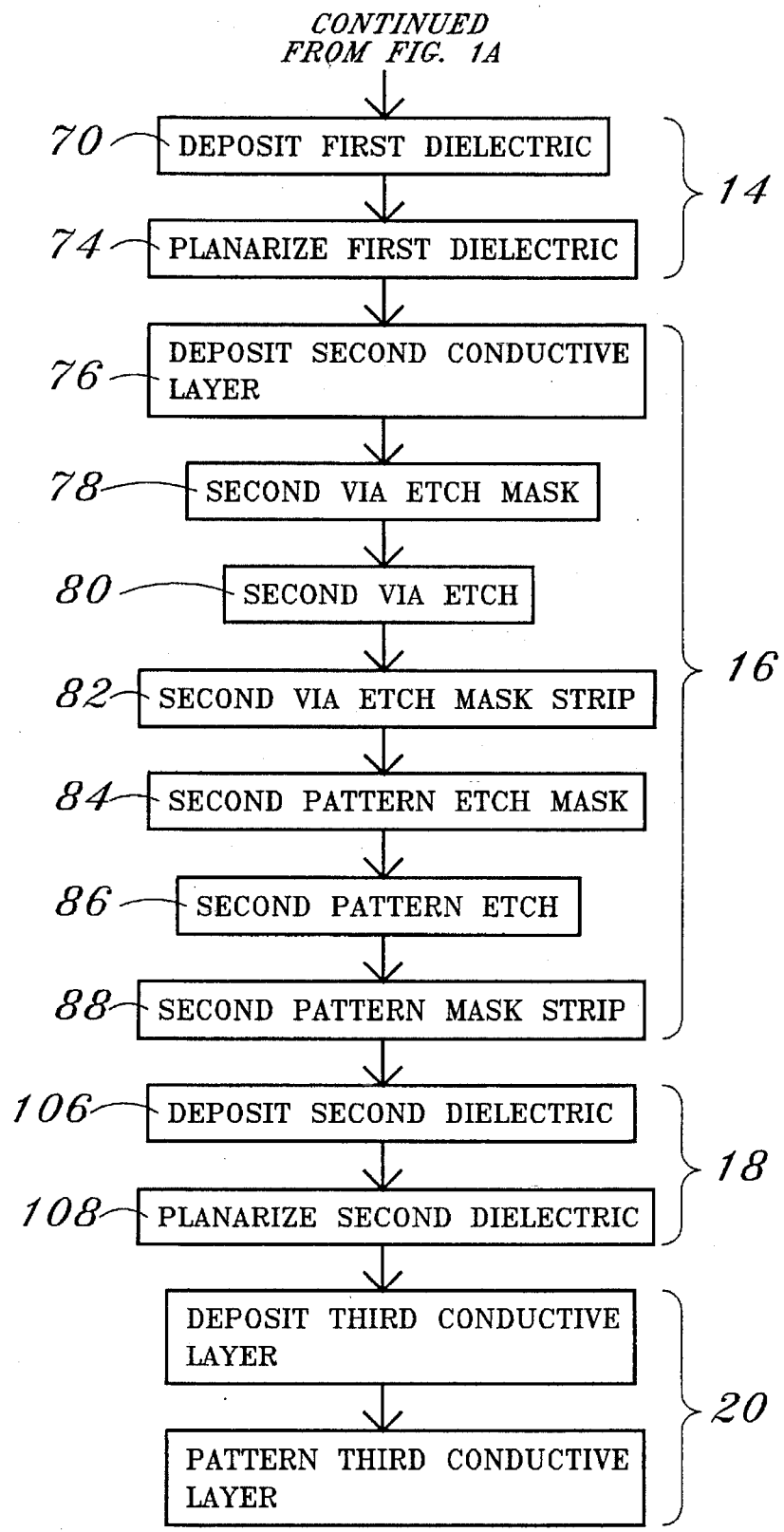

The best presently known mode for carrying out the present invention is shown as a series of steps in FIGS. 1A and 1B, and designated by the general reference character 10. The process of the present invention is divided into three general process sections, which include a first conductive layer patterning section 12, a first interlayer deposition and planarization section 14, a second conductive layer patterning section 16 a, second interlayer deposition and planarization section 18, and a third conductive layer patterning section 20. Each process section includes a number of specific process steps discussed in further detail below. FIGS. 2A–2M set forth sequential, partial, cross sectional views of an integrated circuit manufactured with the present invention. FIGS. 2A–2M will be referred to in conjunction with process steps set forth in FIGS. 1A and 1B.

Figure 2A:
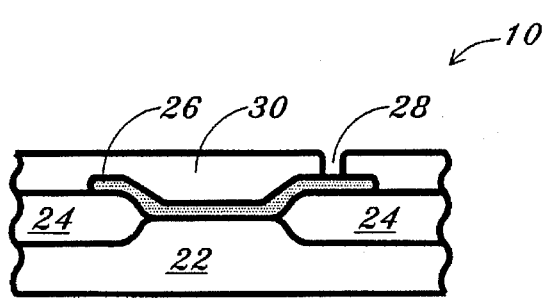
FIGS. 2A–2M are cross sectional views illustrating, sequentially, a portion of an integrated circuit manufactured with the preferred embodiment of the present invention.

A cross sectional view of an integrated circuit prior to the process of the present invention 10 is illustrated in FIG. 2A, and sets forth a semiconductor substrate 22, field oxide 24, MOS gate 26, a gate contact hole 28, and base dielectric layer 30.

As set forth in FIG. 1A, the first conductive layer patterning section 12 begins with a "determine first conductive layer thickness" step 32. A first conductive layer 34 is selected to have a total vertical thickness that includes a desired vertical thickness of a first metallization pattern and a desired via structure vertical thickness. Via structure and metallization dimensioning are determined by design rules of particular processes and are well known in the art.

Figure 2E:
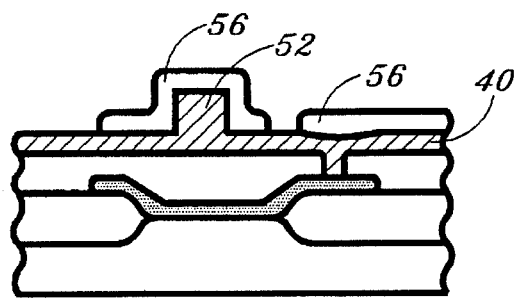
Figure 2B:
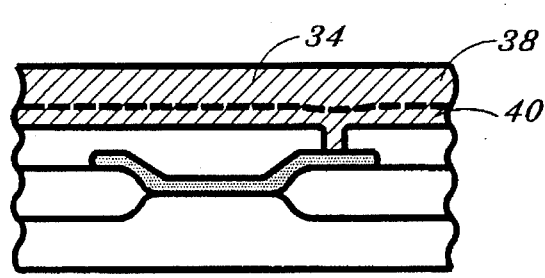

Once the first conductive layer 34 thickness is determined, a "deposit first conductive layer" step 36 deposits a first conductive layer 34 over the base dielectric 30. As illustrated in FIG. 2B the first conductive layer 34 can be conceptualized as having a first via portion 38 and a first pattern portion 40. The first via portion 38 is a top layer of the first conductor 34 having a uniform vertical thickness corresponding to the desired vertical thickness of a first via structures. Correspondingly, the first pattern portion 40 is a layer below the first via portion 38 having a uniform vertical thickness corresponding to the desired first conductive pattern vertical thickness. It is understood, that in the preferred embodiment 10, the entire first conductive layer 34 is of uniform material, and the division of the first conductive layer 34 into the first via portion 38 and the first pattern portion 40 is, for the preferred embodiment 10, purely a conceptual one.

In the preferred embodiment 10, the first conductive layer 34 is aluminum deposited via evaporation methods. The base dielectric layer 30 is reflowed borophosphosilicate glass (BPSG) and the gate contact hole 28 includes a silicide diffusion barrier. It is understood that other materials and deposition methods could also be employed depending on anticipated current requirements and operating environments, including temperature. Among the many alternate materials are copper, tungsten, titanium, tantalum, molybdenum, nickel, chromium, gold, silver, and silicon. Silicides, other non-silicon alloys, and additive elements are also possible. Such varying materials can be used to arrive at superconductive materials, photosensitive materials, optically transparent conductive materials, and electromigration resistant materials as well as diffusion and reaction barrier layers. One skilled in the art would also recognize there exists many alternative deposition methods, including, but not limited to, sputtering, chemical vapor deposition (CVD), plasma enhanced CVD (PECVD), electroplating, spin coating, neutral beam/stream deposition, plasma spray deposition or even paint coating.

Figure 2F:
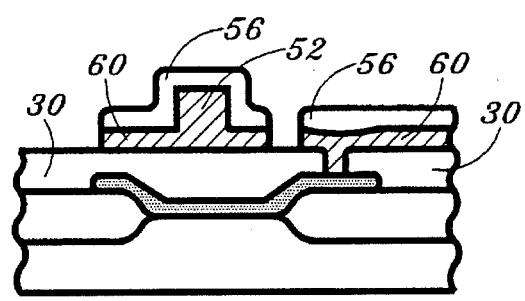
Figure 2C:
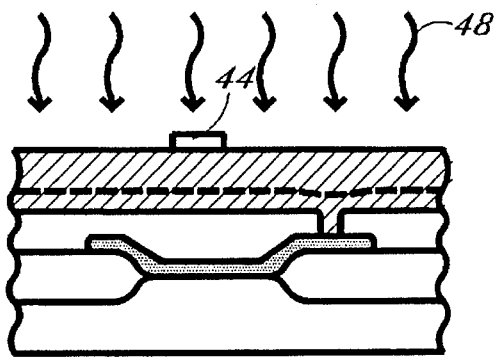

After the first conductive layer 34 is deposited, a "first via etch mask" step 42 results in a first via etch mask 44 on the surface of the first conductive layer 34, as shown in FIG. 2C. In the preferred embodiment 10, the creation of the first via etch mask 44 is accomplished through photolithographic methods. These methods are well known in the art, and for that reason will not be set forth in detail herein. The via etch mask 44 is positioned above a desired location of a via structure, and has the same shape as the horizontal cross sectional aspect of the desired via structure.

Following the creation of the first etch mask 44 the first conductive layer 34 is subjected to a "first via etch" step 46. Using known etch rates for the first conductive layer 34, the first via portion 38 is uniformly removed except where blocked by the first via etchmask 44. The via etch method of the preferred embodiment is reactive ion etching (RIE) and is fancifully designated as 48 in FIG. 2C. While RIE is set forth in the preferred embodiment 10, one skilled in the art would recognize that many alternate etching methods could be employed. Among the many etch methods are inductively coupled plasma etch, helicon wave plasma etch, helical resonance etch, electron cyclotron resonance (ECR), chemical downstream etching, neutral beam/stream etching, photon assisted wet chemical or plasma etch, or wet chemical etch.

Figure 2G:
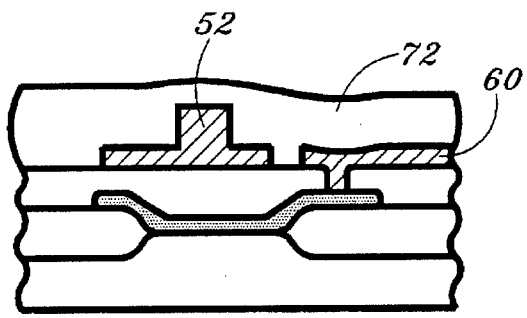
Figure 2D:
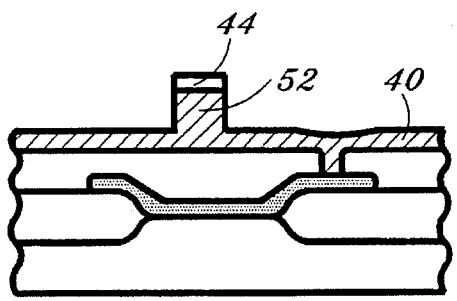
Figure 2H:
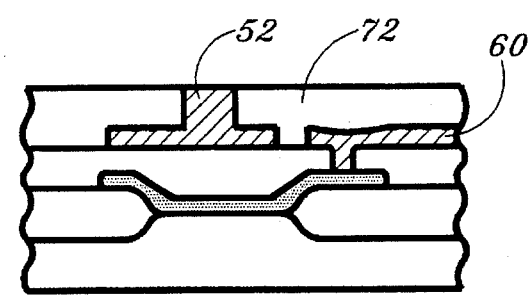

In the preferred embodiment 10 the first via mask 44 is removed with a "first via mask strip" step 50. The resulting first conductive layer 34, as shown in FIG. 2D, includes the first pattern portion 40 and a first via structure 52. It is noted that RIE was the chosen etch method for its degree of anisotropy. It is understood that alternative etches, including, but not limited to those mentioned above for the "first via etch mask" 42 could also be employed. One skilled in the art would also recognize that the "plug" shape of the via structure 52 created by the anisotropic etch, is by no means limiting. Via structures 52 having positively sloped features may be employed according to variations in interlayer dielectric selection. Variations in dielectric material affecting dielectric step coverage could make via structures having positively sloped features more desirable. It is noted that while the preferred embodiment 10 employs a "first via mask strip" step 50, this step is optional. The first via etch mask 44 could remain in place and be removed by a subsequent mask strip step, as will be discussed below.

Following the creation of the first via structures 52 in the first conductor layer patterning section 12, the process continues with a "first pattern etch mask" step 54. The "first patterning etch mask" step 54, like the "first via etch mask" step is very similar to conventional metal patterning steps. Photolithographic techniques are employed to create a first pattern etch mask 56 which possesses the desired metallization or "wiring" pattern of a first conductive pattern. The present invention 10 diverges from prior art patterning process in that the first pattern etch mask 56 covers the first via structures 52 as well as the exposed pattern portion 40 of the first conductive layer 34, shown in FIG. 2E. One would recognize that in the event there is no "first via etch mask strip" step 50, or the first via structures 52 include some other sort of etch stop layer, the first pattern etch mask 56 need not cover the first via structures 52. It is also noted that the thickness of the first pattern etch mask 56 could be greater or lesser, and the example set forth in FIGS. 2E and 2F is meant to be illustrative, and not limiting.

Once the first pattern etch mask 56 is created, the first conductive layer 40 is subjected to a first pattern etch 58. Because the first conductive layer 34 is of uniform material, the chosen etch method for the first pattern etch step 58 is the same as that of the first via etch step, that is, RIE 48. Of course, variation of the RIE etch 48 is acceptable to increase the etch selectivity over base dielectric layer 30 or for the purposes of etching profile and particle control. The first pattern etch step 58 eliminates the unmasked portion of the first conductive layer 34 and creates a first conductive pattern 60. A cross sectional view of the resulting structure is depicted in FIG. 2F.

The first pattern etch mask 56 is stripped in a first pattern mask strip 62 leaving a first conductive pattern 60 with a number of integral first via structures 52. If the "strip first via etch mask" step 50 is omitted the first via etch mask 44 could be removed at this step along with the first pattern etch mask 56.

While the preferred embodiment 10 set forth above employs a first conductive layer 34 of a uniform material, it is understood that the first conductive layer 34 could be a multilayer metallization layer. Such an alternate scheme is set forth in FIG. 3. The alternate scheme includes identical items to those set forth in FIGS. 2A–2M. Thus, for the discussion of this multilayered metallization scheme, identical items to those appearing in the preferred embodiment will be referred to by the original reference number with an initial digit "3".

Figure 3A:
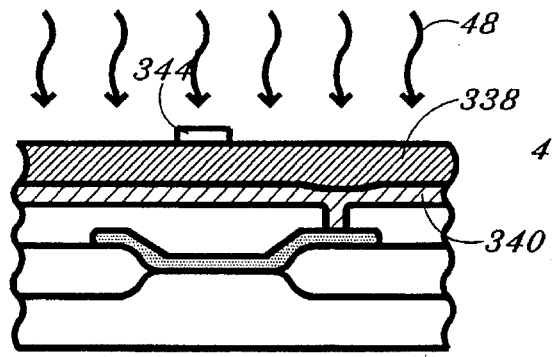
FIGS. 3A and 3B illustrate a variation of the preferred embodiment employing a two layer first conductive layer.
Figure 3B:
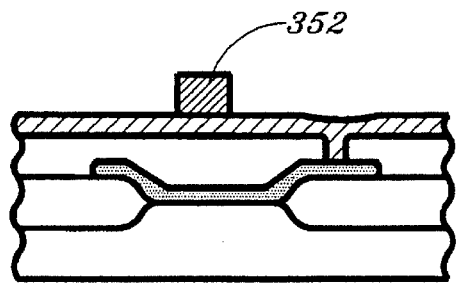

As illustrated in FIG. 3A the first conductive layer 334 is deposited in two layers, the first via portion 338 being a different material than the first pattern portion 340. In this alternative example the delineation between the first pattern portion 340 and the first via portion 338, unlike the preferred embodiment 10, is not conceptual. Such an arrangement allows for the selective etching of the first via portion 338 with respect to the first pattern portion 340. Selective etching between the first via portion 338 and the first pattern portion 340 provides more process control at the cost of increased complexity in the first conductive patterning section 12. FIG. 3B illustrates the first conductive layer 334 following the first via etch and first via etch mask strip steps (46 and 50). The resulting structure includes a first via structure 352 composed from a different material than that of the first pattern portion 340.

Figure 4A:
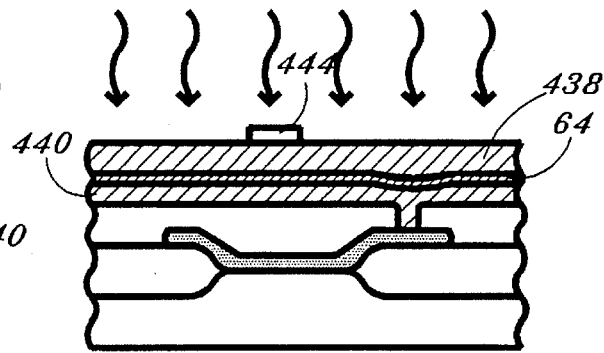
FIGS. 4A–4C illustrate a variation of the preferred embodiment employing a first conductive layer having a barrier layer therein.
Figure 4B:
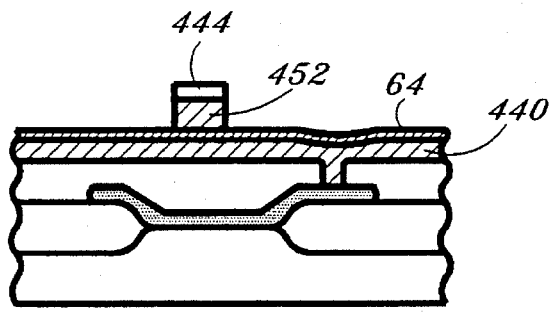
Figure 4C:
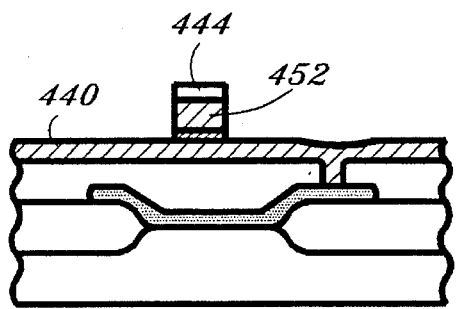

Multilayer metallization of three or more layers for the first conductive layer 34 is also possible. This alternative scheme is illustrated in FIG. 4, and, as in FIGS. 3A and 3B, identical components to those of FIGS. 2A–2M that appear in FIG. 4 will be referred to by the same reference number of the preferred embodiment 10, preceded by the digit "4". The first conductive layer 434 is deposited with a first via portion 438, a first pattern portion 440, and an intermediate thin conductive etch barrier layer 64, as shown in FIG. 4A. The first via etch step 446 would be a two step process requiting an initial via etch step and an etch barrier layer etch step either before or after the via etch mask 444 is stripped. An illustrative example of a device following the initial via etch step is illustrated in FIG. 4B. As shown in the figure, the resulting structure includes the etch barrier layer 64 which has protected the first pattern portion 440. The first via mask 444 from FIG. 4A has resulted in a first via structure 452. Following the initial via etch step the portions of the etch barrier layer 64 that are not covered by the first via etch mask 444 or the first via structure 452, are etched away. The resulting structure is shown in FIG. 4C.

Referring now to FIGS. 1 and 2A–2M, the first interlayer deposition and planarization section 14 of the present process 10 begins with a deposit first dielectric layer step 70. As is illustrated in FIG. 2G a first dielectric 72 is deposited over the first conductive pattern 60 and the first via structures 52. The thickness of the first dielectric layer 72 is chosen to be similar to, or greater than the total vertical thickness of the via structures 52 and the first conductive layer 60.

One skilled in the art would recognize that a variety of dielectric materials and deposition processes may be chosen. The selection would depend upon the manufacturing process steps and materials used, which in turn can depend upon the type of device(s) created. Just a few of the possible materials would be doped oxides, such as phosphorous doped oxides (P-Glass) or BPSG, undoped oxides, spin-on glass (SOG) or organic based dielectrics, such as teflon, polyimide, and plastic. One skilled in the art would also recognize that the first dielectric 72 itself could be multilayered to arrive at a dielectric having a more favorable dielectric constant, improved heat resistance, improved planarization, a smoother surface, elimination of pin holes and/or other defects, reduction in particles, more favorable etch rates, etch selectivity and reduction in corrosion.

Depending on the dielectric material chosen, appropriate deposition techniques and post deposition steps would be followed. For example tetraethoxysilane (TEOS) based low pressure chemical vapor deposition (LPCVD) for silicon oxide may be a more suitable method over polysilicon, while silane based LPCVD could work elsewhere. In addition, doped oxides may require a subsequent reflow and/or densification step. PECVD could be used for conformal in situ planarization by using a simultaneous deposition and etch back technique. Other deposition techniques could include CVD, spin coating, neutral beam/stream deposition, or oxidation of silicon films. One skilled in the art would arrive at the appropriate dielectric and accompanying steps following well-known process integration techniques. For that reason, the above examples should not be read as limiting.

In the preferred embodiment 10, following the deposit first dielectric step 70, the first dielectric 72 is planarized in a planarize first dielectric step 74, as shown in FIG. 1. The planarization method of the preferred embodiment 10, is chemical-mechanical polishing (CMP). The CMP process is applied until the first dielectric 72 is planarized and, as is important to the invention, the first via structures 52 are exposed. A cross sectional view of the example device following planarization is set forth in FIG. 2H. While the preferred embodiment 10 uses CMP as a planarization method, other planarization methods may also be employed. Just a few of the possible methods are a dry etch planarization method, where a sacrificial layer of photoresist is deposited, developed and etched back, or mechanical polishing, or, as mentioned previously, PECVD in situ deposit and etch back.

Figure 2I:
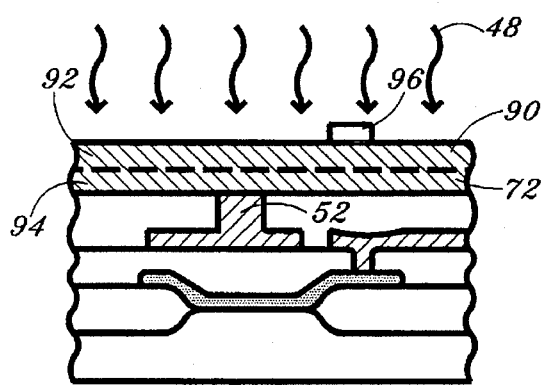

The second conductor layer patterning section 16 of the present invention 10 includes a number of process steps similar to the first conductive layer patterning section 12. Therefor, the many alternative materials, methods and structures set forth in the first conductive layer patterning section 12 are also applicable to this process section. The second conductive layer patterning section 16 includes a deposit second conductive layer step 76, a second via etch mask step 78, a second via etch step 80, a second via etch mask strip step 82, a second pattern etch mask step 84, a second pattern etch step 86, and a second pattern mask strip step 88. The deposit second conductive layer step 76 results in a second conductive layer 90 over the first dielectric layer 72 and first via structures 52. The deposition of the second conductive layer 90 creates a conductive connection between the first via structures 52 and the second conductive layer 90. As illustrated in FIG. 2I, the second conductive layer 90, like the first conductive layer 34, has two portions, a second via portion 92 and a second pattern portion 94. The vertical thickness of the via and pattern portions (92 and 94) are determined according to the same criteria previously described for the first via and pattern portions (38 and 40).

It is noted that the deposit second conductive layer step 76 can be preceded by a via structure precleaning step to remove any native oxides or particles that may interfere with establishing a low resistance contact between the second conductive layer 90 and the first via structures 52.

The second via etch mask step 78, using conventional photolithographic techniques, creates a second via etch mask 96 over the second conductive layer 90 as is set forth in FIG. 2I. A subsequent second via etch step 80 removes the second conductive layer 90 except where blocked by the second via etch mask 96. This results in second via structures 98, as set forth in FIG. 2J. The second via etch step 80, as with the first via etch step 50, can vary. In the preferred embodiment 10, RIE 48 is employed, as is fancifully illustrated in FIG. 2I. The second via etch mask is removed with the second via etch mask strip step 82 similar to the first via etch mask strip step 42. It is noted that, like the first via etch mask 44, the second via etch mask could remain in place and be removed in a subsequent stripping step. Thus, the second via etch mask strip step 82 while present in the preferred embodiment 10, is not a critical step.

In the preferred embodiment 10, the second conductive layer 90 is etched into a second conductive pattern 100 in the same manner that the first conductive layer 34 is etched into the first conductive pattern 60. The second pattern mask step 86 produces a second pattern mask 102 on top of the second conductive layer 90. The second pattern mask 102 selectively covers the second conductive layer 90, including the second via structures 98 as illustrated FIG. 2K. Of course, if the second via etch mask remains in p lace, it is not necessary for the second pattern mask to cover the second via structures 98. As in the case of the first layer etch mask 56 as set forth in FIGS. 2E and 2F, the thickness of the second pattern mask 102 as set forth in FIG. 2K should be considered illustrative only.

Figure 2L:
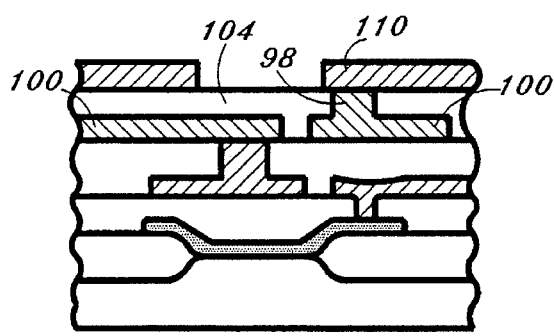
Figure 2J:
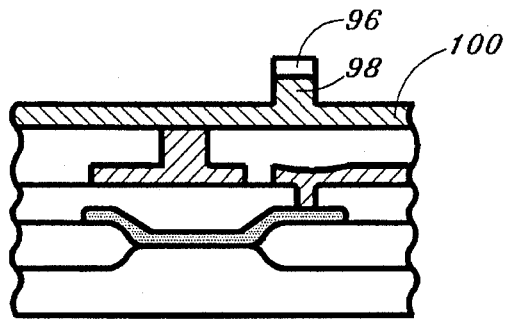
Figure 2M:
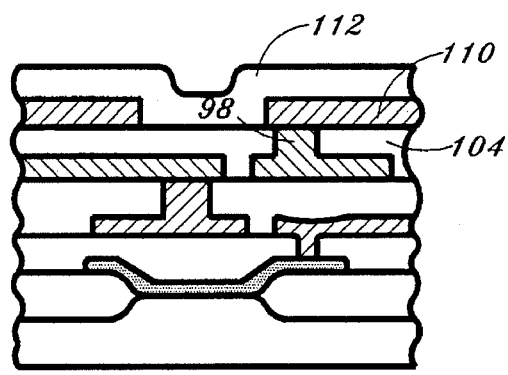
Figure 2K:
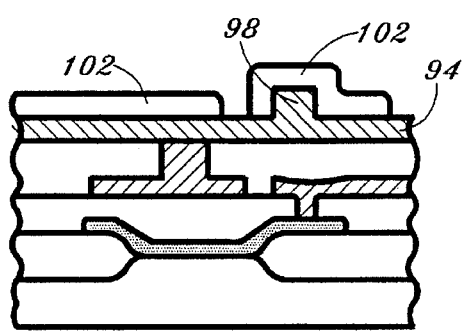

The second pattern etch step 86 etches away those portions of the second conductive layer 90 not covered by the second pattern mask 102. The remaining portions form the second conductive pattern 100, which is illustrated in FIG. 2L. Mask creation is accomplished with standard photolithographic techniques, and, like the first conductive layer patterning section 12, the etch method may vary according to materials used.

The second interlayer deposition and planarization process section 18 follows from the first interlayer deposition and planarization section 14. A second dielectric 104 is deposited over the second conductive pattern 100 in a deposit second dielectric step 106. The second dielectric 104 is then planarized to the level of the second via structures 98 in a planarize second dielectric step 108. Material selection and planarization method for the second dielectric 104 can be selected according the guidelines set forth above for the first dielectric 72.

The third conductive patterning section 20 deposits a third conductive layer over the second dielectric 104 and patterns it into a third conductive pattern 110. The patterning methods for the third conductive pattern 110 are conventional and so will not be discussed herein. The third conductive pattern 110 makes conductive contact with the second via structures 98 completing the wiring pattern for the integrated circuit, as shown in FIG. 2L. The third conductive pattern 110 is subsequently covered with a passivation layer 112, resulting in the structure of FIG. 2M.

Like the second conductive patterning section 16, the third conductive patterning section 20 could include a second via structure 98 pre-cleaning step to ensure good ohmic contact between the second via structures 98 and the third conductive pattern 110.

An alternate embodiment of the present invention focuses on variations in resist composition to achieve the via structures similar to those of the preferred embodiment 10. The alternate embodiment is, in many respects, similar to the preferred embodiment 10 illustrated in FIGS. 2–4. To this end, components which are identical to those appearing in the preferred embodiment 10 will be referred to by reference numbers incorporating the original reference with an initial digit 5. The alternate embodiment example set forth in FIG. 5 illustrates a modification to the first conductive layer patterning section 12 of the preferred embodiment. It is understood that the same modification may be made to the second and third conductive patterning sections (16 and 20) of the preferred embodiment 10.

Referring now to FIG. 5, a series of chronological cross sectional view are presented, depicting the steps of the alternate embodiment 510. The first conductive patterning section 512 of the alternate embodiment 510 begins by depositing a first conductive layer 534. The vertical thickness of this conductive layer is chosen in the same manner as the preferred embodiment. Similarly, the first conductive layer 534 can be conceptualized as having a first via portion 538 that includes the desired via thickness, and a first pattern portion 540 that includes the desired first pattern thickness. The desired materials and deposition technique for the first conductive layer 534 can be determined in accordance with same criteria as the preferred embodiment 10.

Figure 5A:
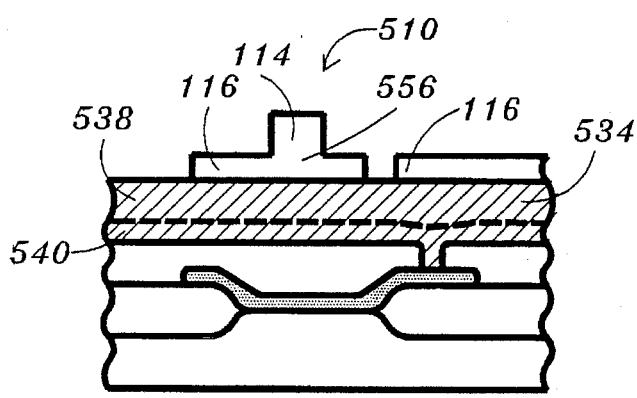
FIGS. 5A–5C illustrate an alternate embodiment of the present invention.
Figure 6A:
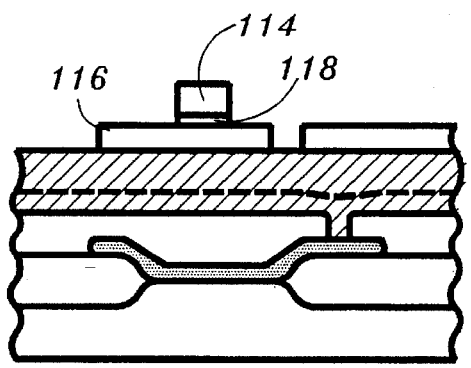
FIGS. 6A–6D illustrate a variation of the alternate embodiment of the present invention using an mask etch barrier.

Unlike the preferred embodiment 10, the alternate embodiment does not include a first via etch mask. Once the first conductive layer 534 is deposited, a first pattern etch mask 556 is placed over the first conductive layer 534, as is illustrated in FIG. 5A.

The first pattern etch mask 556 of the alternate embodiment 510 varies from the first pattern etch mask 54 of the preferred embodiment 10 in that it is multi layered, having a first mask top layer 114 and a first mask bottom layer 116. The first mask bottom layer 116 is created over the first conductive layer 534 and has the desired shape of a first conductive pattern, just as the first layer etch mask 56 of the preferred embodiment 10 corresponds to desired shape of the first conductive pattern 60. The first mask top layer 114 is deposited and patterned on top of the first mask bottom layer 116. The first mask top layer 114, like the first via mask 44 of the preferred embodiment 10, corresponds to desired locations of first via structures.

Following the creation of the first layer etch mask 556, a first conductive pattern 560 and via structures 552 are etched from the first conductive layer. Unlike the first layer etch mask 56 of the preferred embodiment 10, the first layer etchmask 556 of the alternate embodiment 510 is consumed by the first pattern etch step. Therefore, thickness of the first mask top layer 114 and the first mask bottom layer 116 determine the resulting thickness of the first conductive pattern 560 and the via structures 552, respectively. If via structures 552 are to have a vertical thickness that exceeds that of the first conductive pattern 560, the vertical thickness of the first mask top layer 114 will exceed the vertical thickness of the first mask bottom layer 116, accordingly.

Figure 5B:
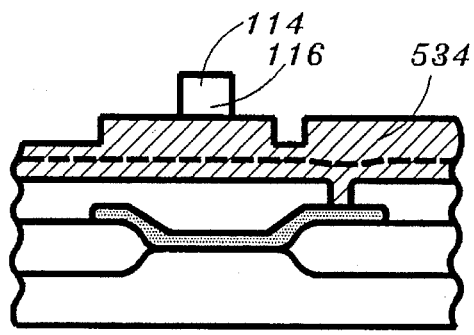

FIG. 5B illustrates the sample device pan during the first pattern etch step. At this point in the etching process the pattern portion 540 of the first mask bottom layer 116 has been etched away, except where covered by the first mask top layer 114. In addition, a portion of the first mask top layer 114 has also been consumed. Where not covered by either mask portion (114 or 116) the first conductive layer 534 is also consumed.

Figure 5C:
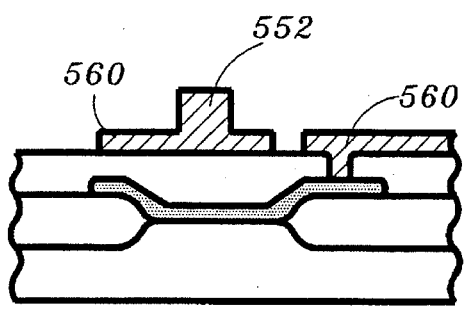

FIG. 5C illustrates the sample device after the first pattern etch step, setting forth the first conductive pattern 560 and a first via structure 552. As previously described, the first conductive pattern topology follows from the first etch mask topology 556.

While the example illustrated in FIGS. 5A–C employs a first pattern etch mask 556 with a material having an etch rate equal to that of the first conductive layer 534, it is understood mask materials having greater or lesser etch rates could also be employed. The etch process could also have more than one etch step, as well.

Figure 6B:
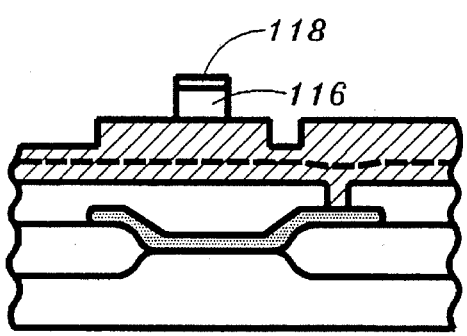
Figure 6C:
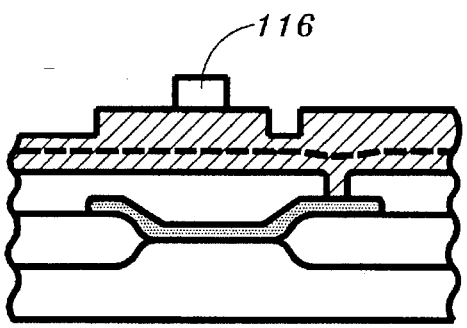
Figure 6D:
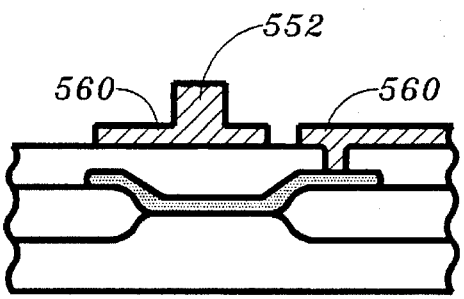

A number of variations to the alternate embodiment 510 could also be employed. One such example is set forth in FIGS. 6A–6D. The first mask top layer 114 includes a patterned etch barrier layer 118. The etch barrier layer 118 is a thin layer where the first mask top layer 114 contacts the first mask bottom layer 116. The etch barrier layer 118 requires a corresponding modification of the first pattern etch step 558. The first pattern etch mask 118 is etched down to the etch barrier layer 118 as illustrated in FIG. 6B. The etch barrier layer 118 may then be removed, as shown in FIG. 6C or removed at a later point in the process. The etch is then continued until the remainder of the first mask bottom layer 116 is consumed and the first conductive pattern 560 is formed with associated first via structures 552. FIG. 6D shows the completed first conductive pattern 560. One skilled in the art would recognize the inclusion of an etch barrier layer 118 while increasing process complexity, also increases process control.

Figure 7A:
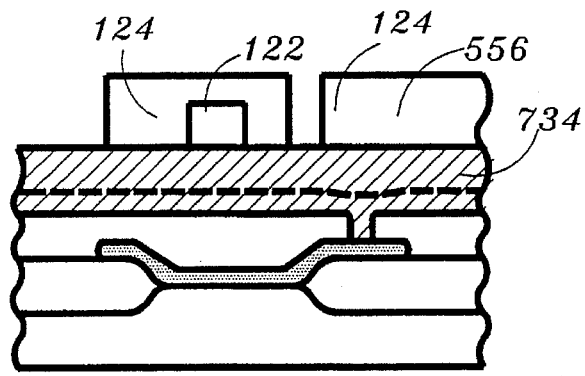
FIGS. 7A–7C illustrate a variation of the alternate embodiment of the present invention using two different mask materials.
Figure 7B:
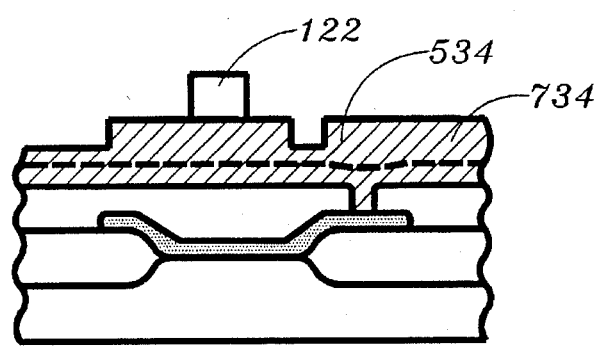
Figure 7C:
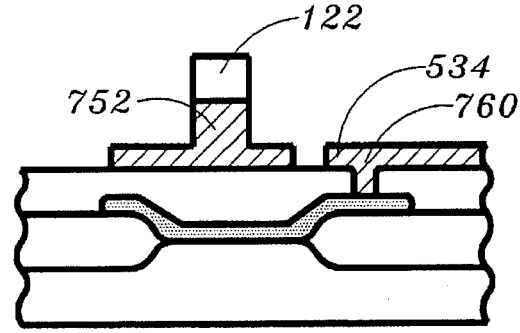

Another variation on the alternate embodiment 510 is set forth in FIG. 7, designated by the general reference character 710, and is shown to include a first layer etch mask 556 that is composed of a first mask material 122 and a second mask material 124. The first and second mask materials (122 and 124) are chosen to be selective to different etches. As illustrated in FIG. 7A, the first mask material 122 has the mask shape of a via etch mask which can be formed by etching or photolithographic techniques. The second mask material 124 has the mask shape of the first conductive pattern deposited over the first mask material 122. The first pattern etch step 558 is a two step process that first removes all of the second mask material 124 leaving the first mask material 122. This is illustrated in FIG. 7B which sets forth the remaining first mask material 122 and the first conductive layer 734 which is partially etched where not covered by the first pattern etch mask 556. A different etch is then employed to consume the first mask material 122 while consuming the remainder of the first conductive layer 534. The resulting structure is the finished first conductive pattern 760, including first via structures 752. The example following the first pattern etch 558 is set forth in FIG. 7C. The use of different materials for the first layer etch mask 556 provides greater process control at the expense of an increase in the complexity of the patterning process. The use of different materials may also be employed to pattern any additional conductive layer. One skilled in the art would recognize that the structure set forth in FIG. 7 could vary in design. Just one such example would be replacing the first mask material 122 by either a different type of conductor or inorganic mask which can be formed by etching with via etch mask 42. The first mask material 122 will not be etched during the first via etch 46 and pattern etch step 58. It is also understood that the thickness set forth in FIG. 7 are illustrative only, the first mask material 122 could be a very thin etch barrier layer.

A second alternate embodiment incorporating multilayered mask designs is illustrated in FIGS. 8A–8G, and designated by the reference character 810. Those elements appearing in the second alternate embodiment 810 that are the same as those set forth in the preferred embodiment will be referred to by their original reference number precede by the digit "8".

Figure 8A:
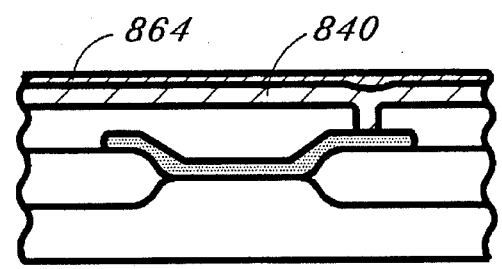
FIGS. 8A–8G illustrate a second alternate embodiment of the present invention.
Figure 8B:
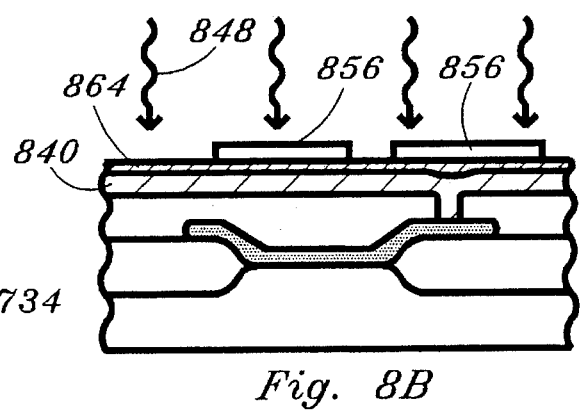
Figure 8C:
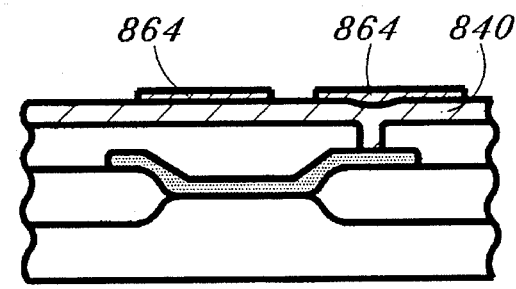

As illustrated in FIG. 8A the first conductive pattern portion 840 is deposited together with a thin, conductive etch barrier layer 864. In the second alternate embodiment 810 such materials as nickel, chromium, copper or another metal alloy are preferred. A first layer etch mask 856 is formed on the etch barrier layer 864 using photolithographic techniques, and the etch barrier layer 864 is then subjected to a first pattern etch mask step 854, as illustrated in FIG. 8B. In the second alternate embodiment 810, for the etch mask step 854, RIE or a wet etch are the anticipated etch method. The resulting structure is set forth in FIG. 8C. It is noted that the etch barrier layer 864 now has the shape of a desired first conductive pattern.

Figure 8D:
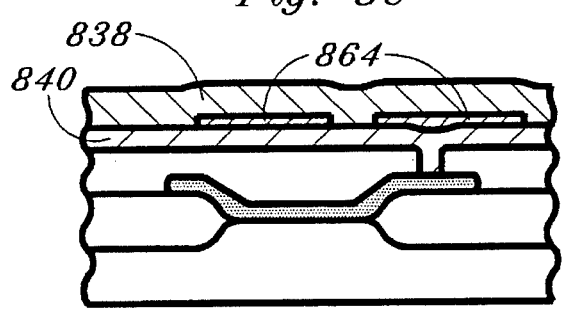
Figure 8E:
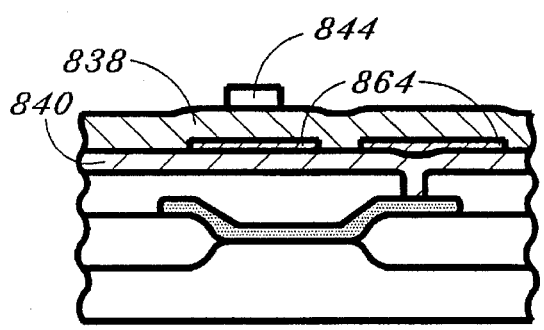

Referring now to FIG. 8D it is shown that a first via portion 838 is deposited over the conductive barrier layer 864 and the exposed portions of the first conductive pattern portion 840. A via mask 844 is subsequently created on top of the via portion 838, as shown in FIG. 8E.

Figure 8F:
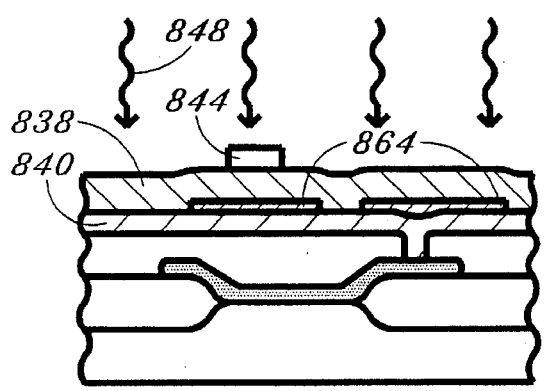
Figure 8G:
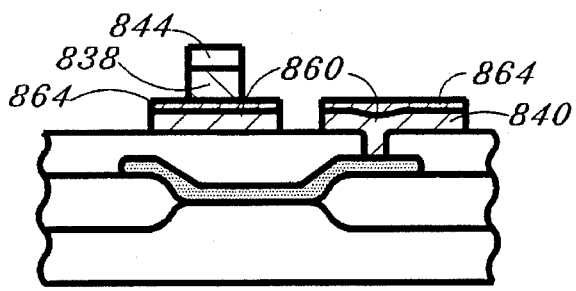

The second alternate embodiment 810 concludes with a first pattern etch step 858 (illustrated fancifully as RIE 848) as is illustrated in FIG. 8F. In the first pattern etch step 858, in a single etch, a first via structure 852 is formed in addition to a first conductive pattern 860. The resulting topography is illustrated in FIG. 8G. One skilled in the art would recognize that in the event the via mask 844 is a nonconductive material, it will have to be subsequently stripped.

Figure 9A:
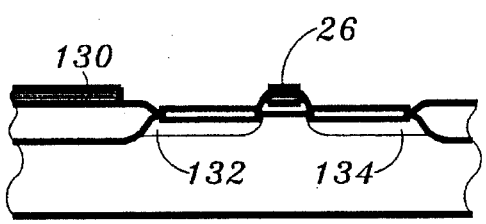
FIGS. 9A–9E illustrate a contact interconnect manufactured with the present invention.

The inventive method may also be used to create contacts to substrate or other layers. This process is set forth in FIGS. 9A–9E. FIG. 9A sets forth a typical CMOS device having a first interconnect 130, a source 132, a gate 26, and a drain 134. It is understood that other contacts could be manufactured, including those for well contacts, substrate contacts, other MOS structures, and bipolar devices.

Figure 9B:
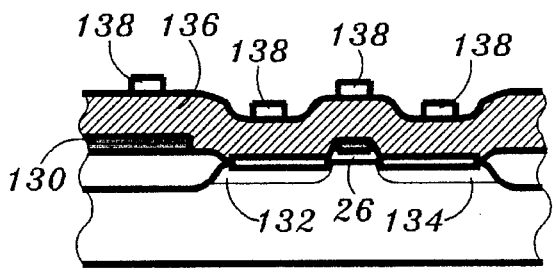
Figure 9C:
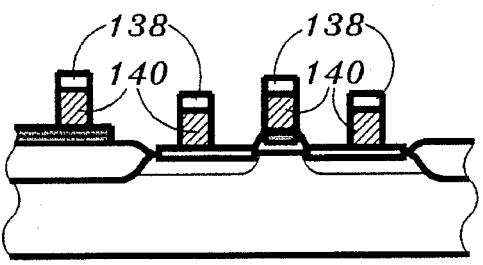

As illustrated in FIG. 9B, a conductive contact layer 136 is deposited over the first interconnect 130, source 132, drain 134, and gate 26. A contact mask 138 is then created over the first contact layer 136. The contact mask 138 is aligned on the contact layer 136 above the desired positions for a contact. In the example of FIG. 9B, this is above the interconnect 130, the source 132, the gate 26, and the drain 134. In the preferred embodiment 10, the contact mask is produced using standard lithographic techniques.

The contact layer 136 is subjected to a contact etch which creates a number of contacts 140 corresponding to the contact mask 138. The resulting structure is set forth in FIG. 9C.

Figure 9D:
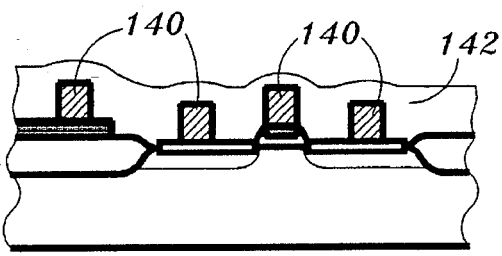
Figure 9E:
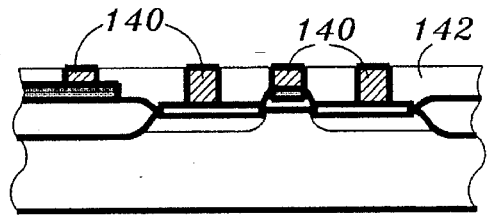

The contact mask 138 is removed and a contact dielectric 142 is deposited over the contacts 140, as shown in FIG. 9D. Following the deposition of the contact dielectric 142, the contact dielectric 142 is planarized until the contacts 140 are exposed. The planarized device is illustrated in FIG. 9E. The device is now ready to receive the first conductive layer which will make ohmic contact with the contacts.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The present inventive method 10 may be utilized in any application requiring vertical interconnect between horizontal conductive layers. This would include all ranges of semiconductor devices, from discrete components to VLSI designs. The inventive method is also applicable to packaging applications, including hybrid integrated circuits, multi-chip modules, pc board fabrication, and other surface mount technologies. This would also include multiple interconnections layers such as fourth, fifth and higher interconnections.

The process 10 may be implemented into existing manufacturing processes with well known process integration techniques as a substitute for one or all of the conductive patterning requirements. The prior an process complexity and deposition equipment necessary to create via structures by etching a hole in a "via etch" process and deposit metal into the "via etch" holes, can be bypassed using the present invention.

Since the present invention may be readily employed using available manufacturing equipment, it is expected that the process will be quickly incorporated into existing industries to produce improved conductive patterning schemes.

For these and other reasons, it is expected that the utility and industrial applicability of the invention will be both significant in scope and long-lasting in duration.

What is claimed is:

1. A method of creating a vertical via interconnect between conductive layers in a semiconductor device comprising the following steps:

a. depositing a first conductive layer;

b. masking the first conductive layer with a topological etch mask having a mask pattern portion and a mask via portion, the mask via portion being situated above the mask pattern portion;

c. etching the first conductive layer to generate a first conductive pattern having integral via portions, the via portions having top surfaces, the first conductive pattern and via portions corresponding to the mask pattern portion and mask via portion, respectively;

d. depositing a dielectric layer over the first conductive pattern;

e. exposing the top surfaces of the via portions;

f. depositing a second conductive layer over said dielectric layer and the top surfaces of the via portions;

g. patterning said second conductive layer to create a second conductive pattern electrically connected to the first conductive pattern by the via portions.

2. The method of claim 1 wherein:

step (e) includes planarizing the dielectric.

3. The method of claim 1 wherein:

step (f) includes pre-cleaning the via portions to ensure ohmic contact between the second conductive layer and the via portions.

4. The method of claim 1 whereby:

etch of step (c) is selective to the topological etch mask and the first conductive pattern.

5. The method of claim 1 wherein:

the via portion of the topological etch mask of step (b) includes a bottom via barrier; and step (c) further includes the substeps of c.1. etching the conductive layer and topological etch mask to the bottom via barrier, the bottom via barrier being an etch stop preserving a remaining etch mask;

c.2. removing the bottom via barrier; and c.3. etching the remaining conductive layer and stripping the remaining etch mask to create the first conductive pattern having via portions.

6. The method of claim 1 wherein:

step (b) includes forming the mask pattern portion over the first conductive layer, depositing a second conductive layer, and forming the via pattern portion over the second conductive layer.

7. The method of claim 1 wherein:

the via portion of the topological etch mask of step (b) includes a bottom via barrier; and step (c) further includes the substeps of c.1. etching the conductive layer and topological etch mask to the bottom via barrier, the bottom via barrier being an etch stop preserving a remaining etch mask; and c.2. etching the remaining conductive layer and stripping the remaining etch mask including the bottom via barrier to create the first conductive pattern having via portions.

8. The method of claim 1, wherein step (a) further includes the substeps of:

a.1. depositing a first portion of the first conductive layer; and a.2. depositing a second portion of the first conductive layer, wherein the second portion of the first conductive layer has etching properties differing from etching properties of the first portion of the first conductive layer.

9. The method of claim 1 wherein step (b) further includes the substeps of:

b.1. forming the mask pattern portion with a first mask material that has a first etch rate during etching; and b.2. forming the mask via portion with a second mask material that has a second etch rate during etching, the second etch rate differing from the first etch rate.

10. A method of creating a vertical via interconnect in a semiconductor device comprising the following steps:

a. depositing a first conductive layer;

b. masking the first conductive layer with a topological etch mask having a mask pattern portion and a mask via portion, the mask via portion being situated above the mask pattern portion; and c. etching the first conductive layer to generate a conductive structure having a conductive pattern and via portions, the via portions having top surfaces, the conductive pattern and via portions corresponding to the mask pattern portion and mask via portion, respectively.

11. The method of claim 10 further comprising the steps of;

d. depositing a dielectric layer over the conductive structure; and e. exposing the top surfaces of the via portions.

12. A method of creating a vertical contact interconnect between a first conductive layer and a substrate layer in a semiconductor device comprising the following steps:

a. depositing a conductive contact layer on the substrate layer;

b. masking the conductive contact layer with a topological etch mask having a mask pattern portion and a mask contact portion, the mask contact portion being situated above the mask pattern portion;

c. etching the conductive contact layer to generate a conductive structure having a conductive pattern and contact portions, the contact portions having top surfaces, the conductive pattern and contact portions corresponding to the mask pattern portion and mask contact portion, respectively;

d. depositing a dielectric layer over the conductive structure;

e. exposing the top surfaces of the contact portions;

f. depositing a first conductive layer over the dielectric layer and the top surfaces of the contact portions; and g. patterning the first conductive layer to create the first conductive layer electrically connected to the substrate layer by the conductive structure.

13. The method of claim 12 wherein step (b) further includes the substeps of:

b.1. forming the mask pattern portion with a first mask material that has a first etch rate during etching; and b.2. forming the mask contact portion with a second mask material that has a second etch rate during etching.

14. The method of claim 12, wherein step (a) further includes the substeps of:

a.1. depositing a first portion of the conductive contact layer; and a.2. depositing a second portion of the conductive contact layer, wherein the second portion of the conductive contact layer has etching properties differing from etching properties of the first portion of the conductive contact layer.

15. The method of claim 12 wherein:

the mask contact portion of the topological etch mask of step (b) includes a bottom contact barrier; and step (c) further includes the substeps of c.1. etching the conductive contact layer and topological etch mask to the bottom contact barrier, the bottom contact barrier being an etch stop preserving a remaining etch mask; and c.2. etching the remaining conductive contact layer and stripping the remaining topological etch mask including the bottom contact barrier to create the conductive structure.

16. The method of claim 12 wherein:

the mask contact portion of the topological etch mask of step (b) includes a bottom contact barrier; and step (c) further includes the substeps of c.1. etching the conductive contact layer and topological etch mask to the bottom contact barrier, the bottom contact barrier being an etch stop preserving a remaining etch mask;

c.2. removing the bottom contact barrier; and c.3. etching the remaining conductive layer and stripping the remaining topological etch mask to create the conductive structure.

17. The method of claim 12 wherein:

step (b) includes forming the mask pattern portion over the conductive contact layer, depositing a second conductive contact layer, and forming the mask contact portion over the second conductive contact layer.

18. A method of creating a vertical contact from a substrate layer, the method comprising the following steps:

a. depositing a conductive contact layer on the substrate layer;

b. masking the conductive contact layer with a topological etch mask having a mask pattern portion and a mask contact portion, the mask contact portion being situated above the mask pattern portion; and c. etching the conductive contact layer to generate a conductive structure having a conductive pattern and contact portions, the contact portions having top surfaces, the conductive pattern and contact portions corresponding to the mask pattern portion and mask contact portions, respectively.

19. The method of claim 18 further comprising the steps of:

d. depositing a dielectric layer on the conductive structure; and e. exposing the top surfaces of the contact portions.

20. The method of claim 19 wherein:

step (e) includes planarizing the dielectric.

21. The method of claim 20 wherein:

planarizing the dielectric includes chemical-mechanical polishing the dielectric.

22. The method of claim 19 further comprising the step of:

f. pre-cleaning the contact portions to ensure ohmic contact between a subsequently deposed conductive layer and the contact portions.

23. A method of creating a vertical via interconnect in a semiconductor device comprising the following steps:

a. depositing a first conductive layer;

b. masking the first conductive layer with a topological etch mask having a mask pattern portion and a mask via portion, a portion of the mask pattern portion being situated above the mask via portion; and c. etching the first conductive layer to generate a first conductive pattern having integral via portions, the via portions having top surfaces, the first conductive pattern and via portions corresponding to the mask pattern portion and mask via portion, respectively.

24. The method of claim 23 further comprising the steps of:

d. depositing a dielectric layer over the first conductive pattern; and e. exposing the top surfaces of the via portions.

25. The method of claim 24 wherein:

step (e) includes planarizing the dielectric.

26. The method of claim 25 wherein:

planarizing the dielectric includes chemical-mechanical polishing the dielectric.

27. The method of claim 24 further comprising the steps of:

f. depositing a second conductive layer over said dielectric layer and the top surfaces of the via portions;

g. patterning said second conductive layer to create a second conductive pattern electrically connected to the first conductive pattern by the via portions.

28. The method of claim 27 wherein:

step (f) includes pre-cleaning the via portions to ensure ohmic contact between the second conductive layer and the via portions.

29. The method of claim 23 wherein step (b) further includes the substeps of:

b.1. forming the mask pattern portion with a first mask material that has a first etch rate during etching; and b.2. forming the mask via portion with a second mask material that has a second etch rate during etching.

30. The method of claim 23, wherein step (a) further includes the substeps of:

a.1. depositing a first portion of the first conductive layer; and a.2. depositing a second portion of the first conductive layer, wherein the second portion of the conductive layer has etching properties differing from etching properties of the first conductive layer.

31. The method of claim 23 wherein:

the via portion of the topological etch mask of step (b) includes a bottom via barrier; and step (c) further includes the substeps of c.1. etching the conductive layer and topological etch mask to the bottom via barrier, the bottom via barrier being an etch stop preserving a remaining etch mask;

c.2. removing the bottom via barrier; and c.3. etching the remaining conductive layer and stripping the remaining topological etch mask to create the first conductive pattern having via portions.

32. The method of claim 23 wherein:

the via portion of the topological etch mask of step (b) includes a bottom via barrier; and step (c) further includes the substeps of c.1. etching the conductive layer and topological etch mask to the bottom via barrier, the bottom via barrier being an etch stop preserving a remaining etch mask; and c.2. etching the remaining conductive layer and stripping the remaining topological etch mask including the bottom via barrier to create the first conductive pattern having via portions.

33. A method of creating a vertical contact interconnect between a first conductive layer and a substrate layer in a semiconductor device comprising the following steps:

a. depositing a conductive contact layer on the substrate layer;

b. masking the conductive contact layer with a topological etch mask having a mask pattern portion and a mask contact portion, a portion of the mask pattern portion being situated above the mask via portion;

c. etching the conductive contact layer to generate a conductive structure having a conductive pattern and contact portions, the contact portions having top surfaces, the conductive pattern and contact portions corresponding to the mask pattern portion and mask contact portion, respectively;

d. depositing a dielectric layer over the conductive structure;

e. exposing the top surfaces of the contact portions;

f. depositing a first conductive layer over the dielectric layer and the top surfaces of the contact portions; and g. patterning the first conductive layer to create the first conductive layer electrically connected to the substrate layer by the conductive structure.

34. The method of claim 33 wherein step (b) further includes the substeps of:

b.1. forming the mask pattern portion with a first mask material that has a first etch rate during etching; and b.2. forming the mask contact portion with a second mask material that has a second etch rate during etching.

35. The method of claim 33, wherein step (a) further includes the substeps of:

a.1. depositing a first portion of the conductive contact layer; and a.2. depositing a second portion of the conductive contact layer, wherein the second portion of the conductive contact layer has etching properties differing from etching properties of the first portion of the conductive contact layer.

36. The method of claim 33 wherein:

the mask contact portion of the topological etch mask of step (b) includes a bottom contact barrier; and step (c) further includes the substeps of c.1. etching the conductive contact layer and topological etch mask to the bottom contact barrier, the bottom contact barrier being an etch stop preserving a remaining etch mask; and c.2. etching the remaining conductive contact layer and stripping the remaining etch mask including the bottom contact barrier to create the conductive structure.

37. The method of claim 33 wherein:

the mask contact portion of the topological etch mask of step (b) includes a bottom contact barrier; and step (c) further includes the substeps of c.1. etching the conductive contact layer and topological etch mask to the bottom contact barrier, the bottom contact barrier being an etch stop preserving a remaining etch mask;

c.2. removing the bottom contact barrier; and c.3. etching the remaining conductive layer and stripping the remaining etch mask to create the conductive structure.

38. The method of claim 33 wherein:

step (b) includes forming the mask pattern portion over the conductive contact layer, depositing a second conductive contact layer, and forming the mask contact portion over the second conductive contact layer.

39. A method of creating a vertical contact from a substrate layer, the method comprising the following steps:

a. depositing a conductive contact layer on the substrate layer;

b. masking the conductive contact layer with a topological etch mask having a mask pattern portion and a mask contact portion, a portion of the mask pattern portion being situated above the mask via portion; and c. etching the conductive contact layer to generate a conductive structure having a conductive pattern and contact portions, the contact portions having top surfaces, the conductive pattern and contact portions corresponding to the mask pattern portion and mask contact portions, respectively.

40. The method of claim 39 further comprising the steps of:

d. depositing a dielectric layer over the conductive structure; and e. exposing the top surfaces of the contact portions.

41. The method of claim 40 wherein:

step (e) includes planarizing the dielectric.

42. The method of claim 41 wherein:

planarizing the dielectric includes chemical-mechanical polishing the dielectric.

43. The method of claim 40 further comprising the step of:

f. pre-cleaning the contact portions to ensure ohmic contact between a subsequently deposed conductive layer and the contact portions.

44. A method of creating a vertical via interconnect in a semiconductor device comprising the following steps:

a. depositing a first conductive layer having a vertical thickness;

b. masking said first conductive layer with a via mask, said via mask corresponding to desired via structures;

c. masking said first conductive layer and the via mask with a pattern mask;

d. etching said first conductive layer through the pattern mask to remove a portion of the vertical thickness of the first conductive layer to form a partially etched first conductive layer having upward extending pattern structures, said via mask covering at least a portion of said upward extending pattern structures; and e. etching said first conductive layer and the via mask to forth a first conductive pattern including via structures extending upward therefrom, with each via structure having a top portion, the first conductive pattern and via structures corresponding to the pattern mask and via mask, respectively.

45. The method of claim 44, further comprising the steps of:

f. depositing a dielectric over said first conductive pattern; and g. exposing the top portions of the via structures.

46. The method of claim 45, further comprising the steps of:

h. depositing a second conductive layer over said dielectric and the top portions of said via structures, the second conductive layer making conductive contact with the via structures; and i. patterning said second conductive layer to create a second pattern electrically connected to the first pattern by the via structures.

47. The method of claim 44 wherein:

step (a) includes depositing a multilayered first conductive layer having a pattern portion and a via portion, the via portion situated over the pattern portion;

step (d) includes an etch that is selective to the via portion and not selective to the pattern portion, the pattern portion being an etch stop for the via etch; and step (e) includes etching the pattern portion with an etch that is selective to the pattern portion.

48. The method of claim 44 wherein:

step (a) includes depositing a first conductive layer that includes a barrier layer dividing said first conductive layer into a lower pattern portion and an upper via portion; and step (d) includes etching the first conductive layer to the barrier layer, the barrier layer functioning as an etch stop, said etching creating exposed barrier layer portions and unexposed barrier layer portions, the unexposed barrier layer portions being portions of the barrier layer covered by the pattern structures, the exposed barrier layer portions being subsequently stripped.

49. The method of claim 44 wherein:

step (b) includes using a masking material formed by photolithography and etching techniques.

50. The method of claim 44 wherein:

the etch of step (d) is an isotropic etch.

51. The method of claim 44 wherein:

the etch of step (d) is an-isotropic etch.

52. The method of claim 44 wherein:

step (c) further includes removing portions of the via mask not covered by the pattern mask.

* * * * *